United States Patent [19]

Crooks

[11] Patent Number: 5,442,290
[45] Date of Patent: * Aug. 15, 1995

[54] MRI GRADIENT DRIVE CURRENT CONTROL USING ALL DIGITAL CONTROLLER

[75] Inventor: Lawrence E. Crooks, Richmond, Calif.

[73] Assignee: The Regents of the University of California, Oakland, Calif.

[*] Notice: The portion of the term of this patent subsequent to Jul. 13, 2010 has been disclaimed.

[21] Appl. No.: 924,508

[22] Filed: Aug. 4, 1992

[51] Int. Cl.[6] .......................................... G01R 33/48
[52] U.S. Cl. ...................................... 324/309; 324/318
[58] Field of Search ............... 324/322, 318, 312, 313, 324/319, 309; 128/653.5; 335/219, 290

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,412,178 | 10/1983 | Brown | 324/313 |
| 4,471,305 | 9/1984 | Crooks et al. | 324/309 |
| 4,599,565 | 7/1986 | Hoenninger et al. | 324/309 |
| 4,612,596 | 9/1986 | Fox | 324/322 |
| 4,703,275 | 10/1987 | Holland | 324/322 |
| 4,755,755 | 7/1988 | Carlson | 324/319 |
| 4,761,612 | 8/1988 | Holland et al. | 324/322 |
| 4,788,502 | 11/1988 | Keller et al. | 324/318 |
| 4,829,252 | 5/1989 | Kaufman | 324/309 |
| 4,885,542 | 12/1989 | Yao et al. | 324/313 |
| 4,928,063 | 5/1990 | Lampman et al. | 324/324 |
| 4,933,639 | 6/1990 | Barker | 324/309 |
| 4,970,457 | 11/1990 | Kaufman et al. | 324/309 |
| 5,066,914 | 11/1991 | Vavrek et al. | 324/309 |
| 5,153,516 | 10/1992 | Gopalsami et al. | 324/309 |
| 5,227,728 | 7/1993 | Kaufman et al. | 324/318 |
| 5,250,901 | 10/1993 | Kaufman et al. | 324/318 |

OTHER PUBLICATIONS

Motorola Manual—"Linear/switchmode Voltage Regulator Handbook", HB206 Rev. 2—pp. 79–143.
J. Phys. E. Sci. Instrum. 19 (1986)—"Passive screening of switched magnetic field gradients" by R. Turner and R. Bowley, pp. 876–879.

*Primary Examiner*—Sandra L. O'Shea
*Assistant Examiner*—Raymond Y. Mah
*Attorney, Agent, or Firm*—Nixon & Vanderhye

[57] ABSTRACT

An all digital controlled current driver is used for each pulsed electromagnet (e.g., gradient coils) in a magnetic resonance imaging (MRI) system. Such an all digital current controller may be advantageously employed in either closed loop or open loop gradient coil control circuits. The elimination of analog components decreases cost, increases operating efficiency and improves operating characteristics of the MRI system.

19 Claims, 4 Drawing Sheets

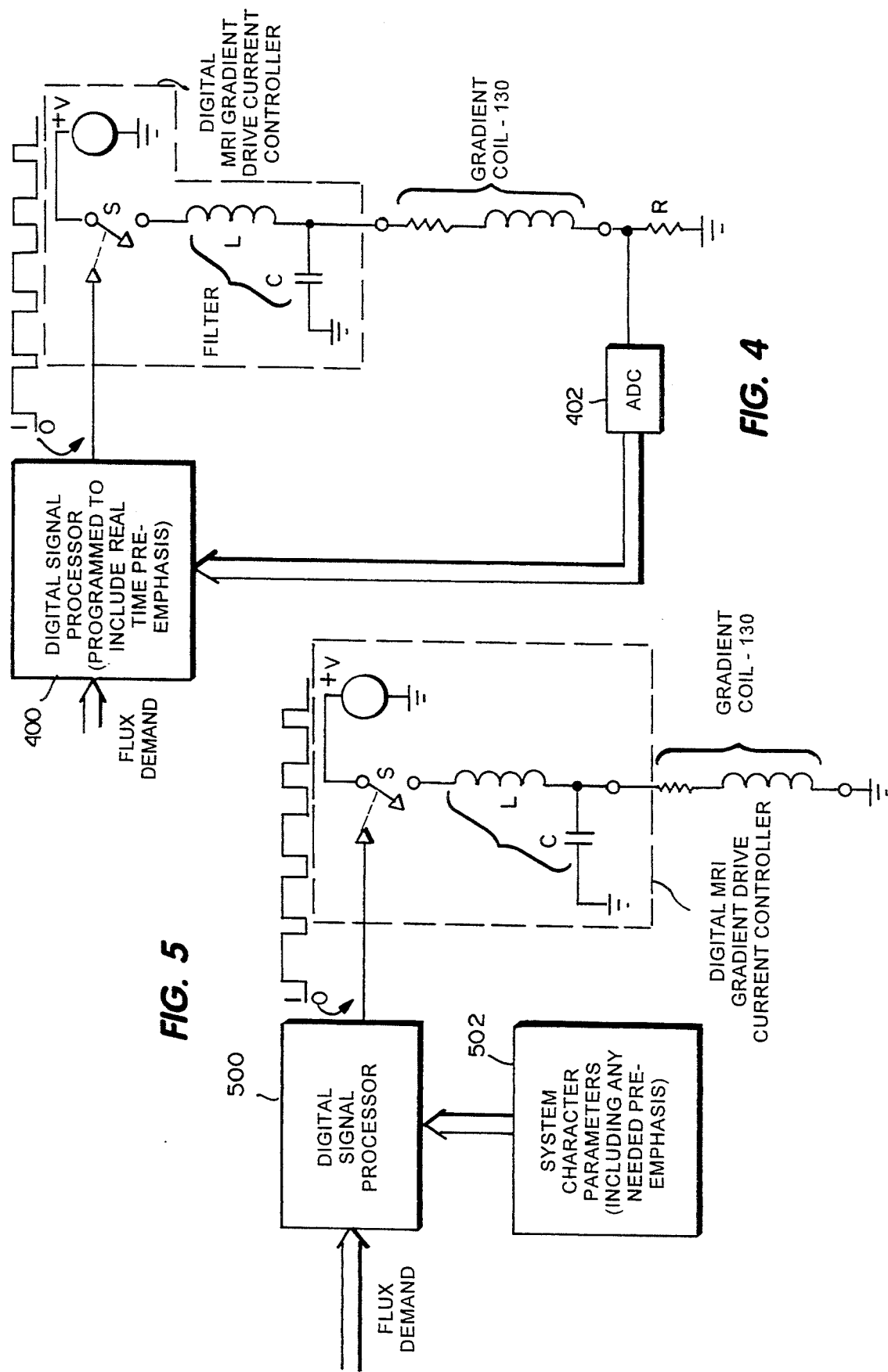

MRI GRADIENT DRIVE CURRENT CONTROL USING ALL DIGITAL CONTROLLER

BACKGROUND OF THE INVENTION

1. Field of the Invention

This invention relates generally to magnetic resonance imaging (MRI) utilizing nuclear magnetic resonance (NMR) phenomena. It more particularly relates to the drive circuits (and control thereof) main or polarizing magnetic field $B_o$ of the typical for gradient coils and/or other similar electromagnet coils utilized to supplement the nominally static MRI main magnet structure.

This invention may be considered as generally related to the following prior, commonly assigned, U.S. patent application:

Ser. No. 07/786,828, filed Nov. 1, 1991 (now U.S. Pat. No. 5,227,723) naming Messrs. Kaufman, Carlson and Gran as inventors and entitled "Gradient Driver Control In Magnetic Resonance Imaging."

2. Related Art

Magnetic resonance imaging systems are now commercially available from a number of sources. There are, in general, several techniques known to those in the art. Some exemplary MRI techniques are set forth, for example, in commonly assigned issued U.S. Pat. Nos. 4,297,637; 4,318,043; 4,471,305 and 4,599,565. The content of these issued patents is hereby incorporated by reference.

In all MRI systems, a main polarizing magnet structure is used to provide a substantially uniform homogeneous magnetic field within a patient image volume along a predetermined axis (e.g., the z axis of the usual x,y,z orthogonal coordinate system). When precisely controlled gradient magnetic fields are superimposed within the image volume along various different axes, the detectable NMR characteristics of NMR nuclei can be spatially encoded (in conjunction with suitable RF nutation pulses) so as to produce RF responses that can be processed to provide two dimensional arrays of display pixel values representing two and/or three dimensional representations of NMR nuclei within the patient volume. However, the accuracy of the MRI process is directly related to the degree of homogeneity in the static field and the degree of linearity in imposed gradient fields along selected axes (the gradient field being a constant as a function of position with respect to other orthogonal axes within the patient volume). To the degree that these desired goals of static field homogeneity and of gradient field linearity along precisely selected axes fail to be attained, then inaccuracies and/or artifacts in the resulting displayed image can be expected. Accordingly, considerable effort previously has been expended toward the ends of either attaining these goals or toward correcting or compensating for deviations from such goals.

Some MRI systems have main polarizing magnet structures that include permanent magnets and/or iron elements in the relevant main magnet magnetic circuit. For example, a relatively low field open architecture main magnet is employed in the MRI system design described by related U.S. Pat. No. 4,829,252. In such structures, the iron components exhibit remanent magnetization and hysteresis effects as a result of their past magnetization history. This can cause a number of undesirable effects such as image distortion, intensity variations, artifacts of various sorts, etc.

Remanent magnetization and hysteresis effects are especially troublesome with respect to the rapid sequential changing energization of gradient coils. For example, the usual phase encoding gradient coils (e.g., oriented to produce a gradient in the y axis dimension) typically are sequenced in 256 steps from a drive pulse of maximum positive value to a maximum negative value (e.g., over 256 successive MRI data gathering cycles). The first large pulse will leave a relatively large remanent magnetization throughout the next 127 successively smaller magnitude positive drive pulses. However, as the drive pulse polarity reverses the remanent gradient will also be caused to be reversed and will then stepwise increase in magnitude throughout the remainder of the complete imaging sequence to a maximum negative value. Furthermore, even for gradient axes which do not change in magnitude or polarity during the entire imaging sequence (e.g., as along the x axis which is typically energized during NMR RF signal readout), a remanent gradient of some sort will remain to possibly distort a subsequent imaging sequence.

Ambient or other environmental changes can also cause undesirable changes in the magnetic field for an MRI system. For example, local changes in the earth's magnetic field or local magnetic field changes induced by local movements of large magnetically permeable masses (e.g., elevators, locomotives, etc.), by magnetic fields caused by the passage of large local electrical currents (e.g., as in the drive circuits of elevators, trolley cars, trains, subways, etc.), by ambient temperature changes and related changes in magnetic circuit properties, by hysteresis effects in magnetically coupled bodies, and the like, are all potential sources of undesired deviations from the optimum spatial distribution of magnetic field orientation and strength within the patient image volume of an MRI system. Such deviations may change throughout any given imaging procedure or over the historical period of system installation at a given site (thus perhaps impairing the ability to accurately compare images taken at the same site at widely separated intervals of time) or ambient conditions as compared between different sites. Currently, substantial efforts are required during installation of an MRI system at a particular site in an attempt to minimize such difficulties. Extra care must currently also be taken to assure quality and repeatability in magnet production for MRI systems. Many special processing steps or other precautions are often required to provide reliability and image quality of sufficiently high standards in view of these ongoing problems. Accordingly, there is considerable need for a more comprehensive and efficient technique to minimize the possible adverse effects of such potential problems.

Another potential source of similar problems are eddy currents generated by rapidly changing magnetic gradient fields in surrounding electrically conductive materials. Associated with each attempted change in the magnetic gradient flux will be the generation of eddy currents which, in conformance with Lenz's law, will produce a magnetic field which opposes the attempted change in the gradient field. Accordingly, it has long been known that some kind of eddy current compensation must be included in the drive current supplied to a gradient coil.

As earlier noted, consistent, reliable operation of a magnetic resonance imaging system relies strongly on the creation of ideal gradient flux pulses inside the volume to be imaged. Nearby electrically conductive structures inherently support eddy current loops when exposed to the rapidly switched gradient fields and these result in distortions to the desired spatial distribution of magnetic flux. Such eddy currents, located in nearby metallic structures, decay in a manner that is characteristic of a collection of somewhat different exponential time constants. If not compensated, the time variation thereby produced in the net magnetic flux actually present at the patient image volume would be sufficiently severe to distort section profile and end-plane resolution of the imaging system.

As a consequence, magnetic resonance images have long used some kind of compensation to reduce the effects of such secondary "eddy" currents. The most common prior technique is an open loop feedback system whereby the gradient flux demand pulse is purposely overdriven (e.g., "pre-emphasized" in a predetermined and pre-calibrated waveform). Determining the exact characteristics of such overdriving for a particular installation site presently requires a considerable and lengthy effort. Hopefully, once this laborious process has been completed, the open loop control system will overdrive the gradient coil in just the right manner to thereafter anticipate the induced eddy currents and to result in a net actual flux field that approximates the ideal. However, not only does this kind of system setup consume considerable time initially and thereafter (in a maintenance mode), it is virtually impossible to find one predetermined overdrive specification that will properly compensate for eddy currents under changing operational conditions. For example, if the magnet structure is a cryogenic super conducting magnet, then as the cryogen boils off, the temperature of various metallic conductor elements may vary which, in turn, causes a change in resistivity and a change in the time response of the eddy current subsystems. Furthermore, spatial variations in eddy current fields often do not exactly track the gradient coil flux field (e.g., spatial dependence may also vary as a function of temperature and other changes in the system). In short, it is virtually impossible for a simple open loop compensation system to exactly correct for eddy current effects. A typical overdrive compensation involves a current overshoot of approximately 20% with a decay to an asymptotic value involving two or three time constants plus a similar undershoot when the drive pulses turn "off" with a similar multi-time constant decay to the asymptotic zero current state.

A less common but somewhat better technique for reducing adverse eddy current effects is to wind a shield coil around the gradient coil. Although this may substantially eliminate the effect of some eddy current fields (e.g., those induced in the aluminum cryogenic container), it occupies a considerable additional portion of the available magnet bore space thus substantially decreasing access to the image volume while adding substantial cost, weight, etc., to the overall MRI system.

As a part of the lengthy setup procedure now required for installation of an MRI system at a particular site, considerable effort is often given to centering the gradient coils in an attempt to avoid asymmetric eddy current effects. If the eddy currents are substantially asymmetric, then there may be no technique known in the prior art for adequately compensating them.

Prior gradient coil drive circuitry typically utilizes a switched power supply with an analog feedback loop used to provide pulse width modulation of the power supply switching. However, such analog feedback for current control in switching power amplifiers may facilitate undesirable drift and/or noise in gradient power amplifiers and may provide a relatively restricted dynamic range. To the extent that such analog circuits obtain analog feedback by a current sensing resistor connected in series with the gradient coil, significant power losses are also incurred in conventional gradient drive controllers. Currently, even those having "digital inputs" are believed to have digital to analog converters so as to produce the usual analog control signal for use in the usual analog feedback loop.

The earlier referenced related application Ser. No. 07/786,828 describes several improvements for gradient drive control circuits in magnetic resonance imaging systems which substantially alleviate or at least improve many of the above-mentioned problems. Perhaps the greatest such improvement is the provision of a closed-loop real-time feedback control for the gradient coil drivers in an NMR system. Here, the actual net gradient flux (e.g., including hysteresis and eddy current effects) is monitored during the imaging procedure on a real-time basis. These inputs are then presented to an integrating feedback controller for each gradient coil control channel so as to modulate the gradient coil current as needed, on a real-time basis, to maintain whatever desired gradient value is then indicated from the main MRI system control (e.g., typically a fixed gradient flux magnitude and polarity for a given length of time).

The flux monitoring coils are preferably patterned after the gradient coils (e.g., properly oriented sets of "saddle" coils of the Golay variety). Helmholtz and/or Maxwell coil configurations (e.g., see U.S. Pat. No. 4,755,755—Carlson) of pancake D-shaped coils and the like may be used if the typical open-architecture permanent magnet structures are employed (e.g., see U.S. Pat. No. 4,829,252—Kaufman). However, the gradient flux sensing coils must, of course, be located and/or dimensioned so as to occupy a different physical volume than the gradient flux generating coils. For a solenoidal cryogenic superconducting magnet structure, the gradient flux sensing coils may preferably have a slightly reduced radius as compared to the gradient flux generating coils so that they may be closely located just inside the usual gradient coil structure. It should be noted that in presently preferred exemplary embodiments, typically only single turn coils are utilized for the flux sensing coils. Since the conductor of the flux sensing coil does not need to be extensive (e.g., 0.010 to 0.020 inches thick by 0.025 to 0.5 inches wide copper strip), only a slight further incursion is necessitated into the magnet bore space so that no substantial further restriction on patient image volume or access to same is necessitated. To obtain proper balance between the mutual inductance (e.g., magnetic coupling) between the flux sensing coils and the flux generating coils on the one hand and the eddy current/hysteresis flux on the other hand, it may be necessary to slightly offset the flux sensing coils with respect to the flux generating coils (thereby somewhat degrading the mutual inductance between these two sets of coils).

Although the preferred exemplary embodiment utilizes flux sensing coils which are a substantial replica of the gradient flux generating coils, the net magnetic flux within the patient imaging volume may be monitored by other arrangements. For example, Hall effect probes, flux gate magnetometers, conventional pickup loops, SQUIDS, electron magnetic resonance detectors (like the ferrites in YIG oscillators) etc., may be strategically located with outputs appropriately combined so as to detect changes from an initial or desired magnetic flux state.

SUMMARY OF THE INVENTION

The present invention proposes that purely digital signal processing circuits can be used to complete the closed loop real time feedback system. This results in several system improvements even if utilized only in conjunction with the usual open loop gradient coil control system.

As now should be apparent, such a closed loop real time control system may also provide substantial correction for rapidly changing gradient fields induced by environmental disturbances or the like. Furthermore, the closed loop feedback system compensates for ongoing changes in the magnet structure (e.g., as a function of cryogen boil-off, ambient temperature changes, ambient magnetic field changes, etc.). By decreasing gradient coil driver box adjustments and by reducing the exactness of required gradient coil centering during initial MRI systems setup, not only is system performance materially improved (e.g., by maintaining accurate eddy current compensation even if the magnet drifts or a change in amplifier characteristics occurs, etc.), but significant cost reductions also result. Furthermore, different spatial non-uniformities of eddy current distributions may be compensated.

Typical MRI systems may also include a Helmholtz coil pair to make minor adjustments in the "uniform" field. The closed loop real-time feedback control system of this invention can also be used advantageously to control such "uniform" field coils (e.g., so as to reduce time dependent anomalies).

In the preferred exemplary embodiments, the analog flux sensing signal is converted to digital form for each of the electromagnet coils that is to be separately controlled. A shared digital signal processor (e.g., a properly programmed digital computer) may then be time shared amongst the different control channels. The same digital signal processor receives digital flux demand signals from the MRI system control computer (e.g., requesting the generation of a uniform or linear magnetic gradient flux within the patient image volume at a particular time for a particular direction and to be held constant until further instructed) for each gradient control channel. The digital signal processor then compares the sensed actual net flux with the demanded flux and derives an appropriate feedback control signal (e.g., in accordance with a simple integral feedback control) so as to generate an appropriate input to the current supply source for the appropriate electromagnet coil. As will be appreciated, such a real time closed loop feedback system will automatically result in the "right" magnitude and time decay of overshoot (when initiating a new flux gradient field) and undershoot (when terminating the flux gradient field pulse).

An extension of this method may use a series of flux sensors to monitor spatial inhomogeneities of the eddy current flux field. A set of smaller, higher order, field coils could then be driven in closed loop real time feedback fashion to remove the detected spatial non-uniformities of eddy current flux fields—thus achieving a higher degree of eddy current compensation over a larger volume. Alternatively, a set of such higher order compensation coils could be driven with an open loop drive setup based on earlier measured field inhomogeneities. This higher order compensation should also achieve a noticeable reduction in residual eddy current effects over a relatively large volume.

In one exemplary embodiment, the digital signal processor directly produces an appropriate train of pulse width modulated digital on/off control signals to directly control the switchable gradient power supply. The use of such an all digital generator of pulse width modulated switch control may even be advantageously used, in conjunction with the usual current feedback control loop (with an appropriate analog to digital converter) or an entirely open loop all digital control system (which would depend upon a predetermined fixed characterization of parameters for a particular magnet and installation site, etc.).

In one exemplary embodiment, a control computer provides three gradient flux demands. Some flux sensors provide flux measurements that are used to guide a collection of power supplies and coils (perhaps more than three) to produce this flux. This invention relates to the guidance and power supply tasks. The guidance is either formed as or converted to switch controls for the power supplies driving the coils. The switch applies voltage pulses (or current pulses) to the coil via a filter to establish a coil current that gives the desired flux.

Such substantially greater use of digital circuits avoids or minimizes signal conversion processes, eliminates the need to include typically more bulky, costly and less efficient analog circuitry and also avoids certain drift and noise problems typically associated with analog circuitry.

The exemplary embodiments typically difference the feedback and demand signals and integrate the result to determine the desired duty cycle. However, using digital signal processing, one need not be limited to these approaches. For example, to get a fast response a processor may watch for a step in demand, compare the present coil current to the demanded value and spike the voltage (e.g., a 100% duty cycle) to obtain a rapid current variation. After this has occurred, the more typical integrating control loop could be reestablished. The digital processor may also take into account the instantaneous capabilities of the switch and load. For example, based on history (thermal build-up, etc.) the control strategy may be optimally adapted.

BRIEF DESCRIPTION OF THE DRAWINGS

These as well as other objects and advantages of this invention will be more completely understood and appreciated by careful study of the following detailed description of presently preferred exemplary embodiments of this invention in conjunction with the accompanying drawings, of which:

FIG. 4 is an exemplary embodiment of the modified gradient coil current control loop utilizing a digital signal processor (DSP) in what is a mostly digital current feedback control circuit (converting the analog current sense output to digital form as soon as possible); and FIG. 5 is an exemplary embodiment of an entirely open loop but all digital control of a switchable gradient coil power supply.

DETAILED DESCRIPTION OF EXEMPLARY EMBODIMENTS

A typical MRI system includes a large static magnet structure in a "gantry" room for generating a nominally static, nominally uniform, polarizing magnetic field $B_o$ within a patient image volume. The main magnet may be of cylindrical solenoidal construction (e.g., a cryogenic superconducting solenoid). It may also have other configurations (e.g., including permanent magnet structures having opposing pole pieces located above and below the patient image volume, etc.).

Between the main magnet structure and the patient image volume are sets of gradient flux gradients in the static $B_o$ field along the usual generating coils. Typically, the electromagnet gradient coils are designed to generate linear x,y,z coordinate system (e.g., gradient fields $G_x$, $G_y$ and $G_z$). A so-called "uniform" flux generating electromagnet coil may also be included to help calibrate the net effective magnetic flux field $B_o$ within the patient image volume. Such a "uniform" field may be denoted by the reference $G_u$.

Each of the $G_x$, $G_y$, $G_z$, $G_u$ electromagnet coils is driven by its power supply source of electrical current. The controllable current drivers for each coil must be driven with precisely the right amount of current at the right time to generate what is hopefully a substantially uniform gradient flux field within the patient volume that is turned "on" to a predetermined and desired magnitude at precisely the right time and then turned precisely "off" at another desired time or instantaneously switched to a desired magnitude of reverse polarity current, etc. To this end, separately controllable $G_x$, Gy, $G_z$, and $G_u$ gradient current drivers are appropriately connected to their respective gradient coil sets.

The overall MRI process is controlled typically by a control computer. For example, the usual radio frequency transmitter and receiver may communicate via a T/R switch with one or more RF coil structures closely coupled to the appropriate portion of a patient image volume. The NMR RF responses are typically amplified and digitally sampled before being provided to an imaging computer (which is also under control of the system controller). After an appropriate MRI sequence has been completed (which may take several seconds or even several minutes), all of the necessary image data will have been acquired and processed by an imaging computer so as to produce an appropriate image at a control console display (or other appropriate film recording peripheral device as will be appreciated by those in the art). Typically, the control console also includes a suitable keyboard for controlling the control computer and, in turn, all of the other controllable aspects of NMR MRI procedure.

Figure 1:
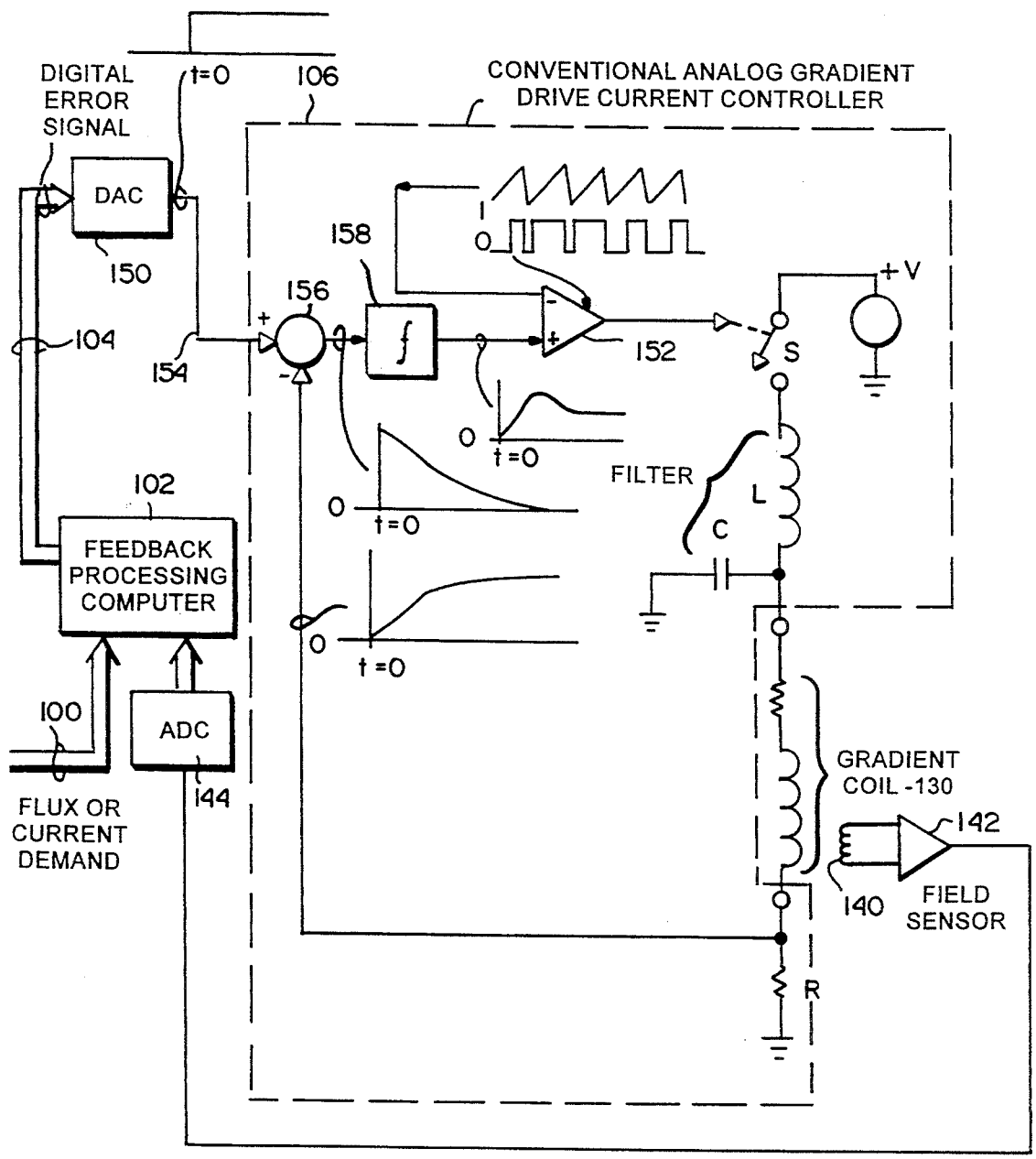
FIG. 1 is a schematic depiction for a closed-loop real-time gradient coil feedback control channel in accordance with the description in the related Kaufman et al application Ser. No. 07/786,828 utilizing a conventional gradient controller which includes a gradient coil analog current control loop.

One aspect of the MRI procedure that has to be carefully controlled by the control computer is the timed sequence of gradient flux pulses. As depicted in FIG. 1 for one gradient control channel, digital flux (or current) demand signals for each of the various electromagnet gradient coils (or directions if multiple correction coils are included) is provided by the control computer on bus 100 to a real-time gradient flux sensor feedback processing computer 102. (Alternatively, the feedback processing computer 102 may be included as a part of the control computer).

For example, at a desired point in an imaging sequence, the control computer may send a digital demand for a predetermined magnitude of positive $G_y$ flux—which flux is to be maintained at a constant linear gradient value until further commanded.

The actual net sensed fluxes for $G_x$, $G_y$, $G_z$ and $G_u$ are thus also presented as inputs to the real-time flux sensor feedback processing computer 102. These are respectively compared to the appropriate flux demand signals provided by the control computer so as to generate the requisite error control outputs 104 to the current driver 106 via DAC 150 thus completing a closed-loop real-time feedback control system.

A given flux sensing coil will have mutual inductance (e.g., magnetic coupling) to its respective flux generating coil and to the magnetic flux generated by eddy currents. If the mutual coupling between these three elements is not properly balanced, then the feedback control may not be properly calibrated (e.g., it may consistently produce slightly less or slightly more actual net magnetic flux than is currently being demanded by the control computer. In experiments utilizing a y-gradient feedback control, it was noted for example that when the center of the flux sensing coils was axially coincident with the center of the flux generating coil, the actual net generated flux was consistently 4% less than demanded by the control computer. However, it was discovered that by slightly reducing the mutual coupling (e.g., by providing a calibrating offset between the center of the flux generating coils and the center of the flux sensing coils (e.g., of about 2 inches) the relative mutual inductances in the system could be appropriately balanced so as to cause the closed-loop real-time feedback control system to accurately and consistently produce substantially exactly the net flux field being demanded at any given time by the control computer. If distributed shielded gradient coil structures are utilized, the mutual coupling to flux sensing coils may inherently be sufficiently reduced so as not to require such a calibrating offset. Of course it should also be possible to achieve calibration by simply causing the control computer to generate the flux demand signal with a reduction of the noted excess or reduced system response if the mutual inductance between the various portions of the relevant magnetic circuits are not properly balanced.

To achieve proper closed-loop feedback control system operation, it is estimated that approximately 20 or so sample points are required during the rising (or falling) edge of the waveform to be controlled. Since the sample control loops are used to control magnetic flux changes having desired time constants on the order of 1 millisecond, this implies the need to supply approximately 1 sample every 50 microseconds to obtain sufficiently fast response times. Although this may be achievable with sufficiently fast digital processing circuits, the use of an analog "front end" comprising opamp integration circuits may be utilized to initially capture the signal and then permit a somewhat slower sampling frequency (e.g., one sample every 200 microseconds) to still obtain sufficiently rapid response times. In effect, the analog front-end includes low pass filtering characteristics.

Although many different kinds of digital processing computers may be used with many different kinds of programs, a relatively simple integral feedback controller process is preferably used in the exemplary embodiment for each of the control channels. If net actually sensed flux is not utilized as the feedback control, then a predetermined decaying pre-emphasis factor may be added to the computed error signals. Furthermore, since totally digital control of the switched current power supply is to be utilized, then the computed error signals must be converted to direct on/off pulse width current switch control signals before being output. Here, the instantaneous duty cycle of on/off current switch control signals are made proportional to the desired instantaneous magnitude of electromagnet coil current.

FIG. 1 depicts the closed-loop gradient current control disclosed by Kaufman et al in related application Ser. No. 07/786,828. Here, the digital error signal 104 for a given channel (e.g., $G_y$) produced by the feedback processing computer 102 is converted to analog form by digital to analog converter 150 before input to a conventional gradient drive current controller 106. Field flux sensing coil 140, via amplifier 142 and analog-to-digital converter 144, provides computer 102 with information corresponding to the actual then-existing gradient flux field. The conventional driver 106 operates its output switch S at a constant frequency and Variable duty cycle. For bipolar drive currents, the comparator 152 and output circuitry are more complex but the unipolar example in FIG. 1 conveys the requisite concepts for those of skill in this art. Here, the analog current demand input at 154 and the sensed current (e.g., corresponding to the voltage drop across current sensing resistor R connected in series with the gradient coil 130 including an inductance and distributed resistance) are differenced at 156, integrated at 158 and presented to the non-inverting input of Comparator 152. A constant frequency saw tooth wave is applied to the inverting input of comparator 152. When the integral of the input difference between the demanded current and the sensed current exceeds the saw tooth wave, comparator 152 turns "on" thus controlling output switch S so as to connect a positive voltage or current supply V to drive the gradient coil 130 via the usual LC filter as also depicted in FIG. 1. The integrator output rapidly increases upon demand giving a high duty cycle for switches. This applies a large voltage to the gradient coil 130 via the filter and increases the coil current. As the output current rises to match the demand, the integrator output drops toward a constant value decreasing the duty cycle for switch S in accordance with the sensed current feedback. In other words, the output pulse width varies with demand as schematically indicated in FIG. 1. Other kinds of analog output control circuits typically may also be used in conventional gradient drive current controllers 106 (e.g., constant pulse width but variable frequency, variable frequency, etc.).

Figure 2A:
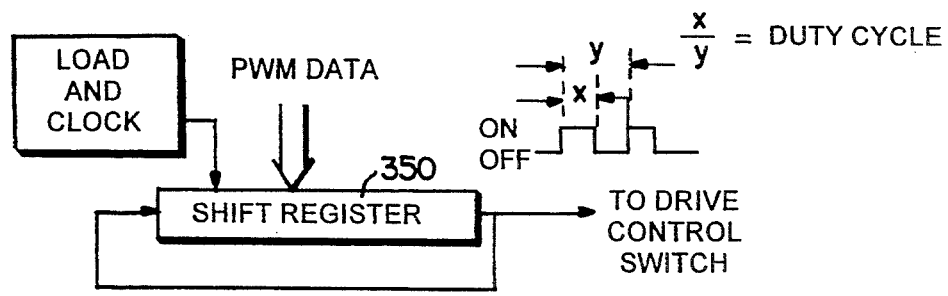
FIG. 2A is a schematic diagram of a possible hardware embodiment for use in outputting the computer-generated switch control signals in FIG. 2.
Figure 2:
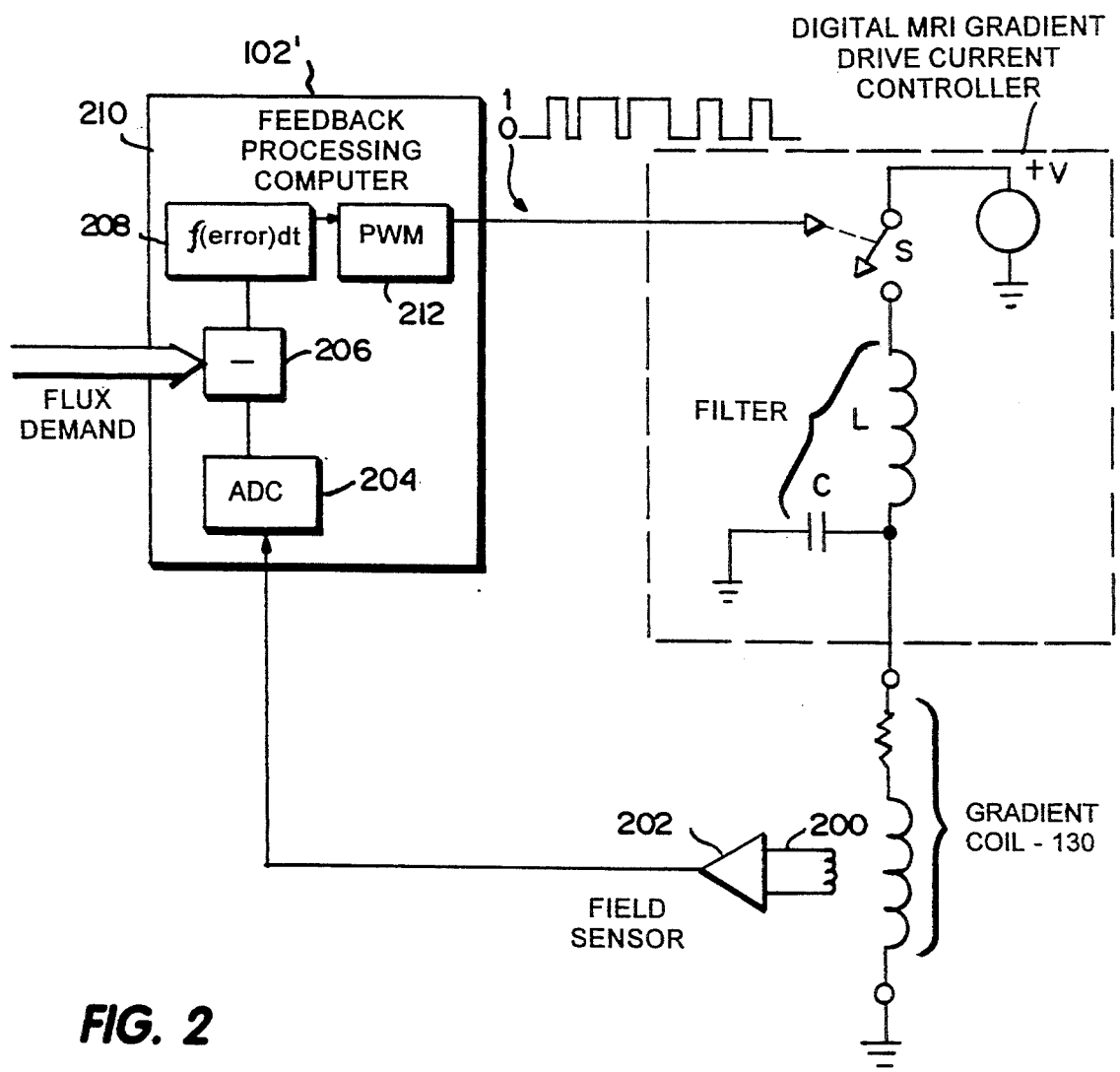
FIG. 2 is a schematic depiction of an exemplary embodiment of this invention which is analogous to FIG. 1 but which eliminates the analog gradient coil current control loop and utilizes the feedback processing computer to directly generate pulse width modulated switch control signals for the gradient coil power supply.

As this invention now recognizes and proposes, the closed-loop feedback control of gradient flux using a computer or other digital signal processor to derive digital error control signals provides an opportunity for using substantially more digital circuitry to control MRI electromagnet currents. For example, as depicted in FIG. 2, gradient flux sensing coil 200 responds to actual net field flux variations to produce an analog signal (which may include some nominal analog front-end processing as by buffer amplifier 202). The analog sense coil output may be quickly digitized (e.g., A-D converter 204, compared to input flux demand signals (e.g., by differencing circuits 206) and integrated (e.g., by integrator 208 in a suitably programmed feedback processing computer 210 which, either directly or via a digital pulse width modulation (PWM) circuit 212, produces variable pulse width switch control signals for switch S supplying current to the gradient coil 130 via a smoothing filter (which may include the inductance and capacitance associated with the electromagnet coil itself). The result is a successively updated set of pulse width modulated switch control signals for controlling current through the corresponding gradient coil set. The updates are repeated sufficiently fast to provide desired time responsiveness for gradient flux pulses.

With conventional analog loop control power supplies, (e.g., as in FIG. 1), various analog components are utilized (also requiring a digital to analog converter if the power supply is designed to accept a digital input control). With the arrangement of FIG. 2, the flux controlling feedback processing computer 210 itself generates a sequence of single on/off control bits to the output switch S. This eliminates substantial numbers of analog components and their associated problems of noise and drift. The embodiment of FIG. 2 also eliminates the usual current sensing resistor R and its associated $I^2R$ wasted power (which can be significant given the relatively large magnitudes of current typically used to drive MRI system gradient coils).

Figure 3:
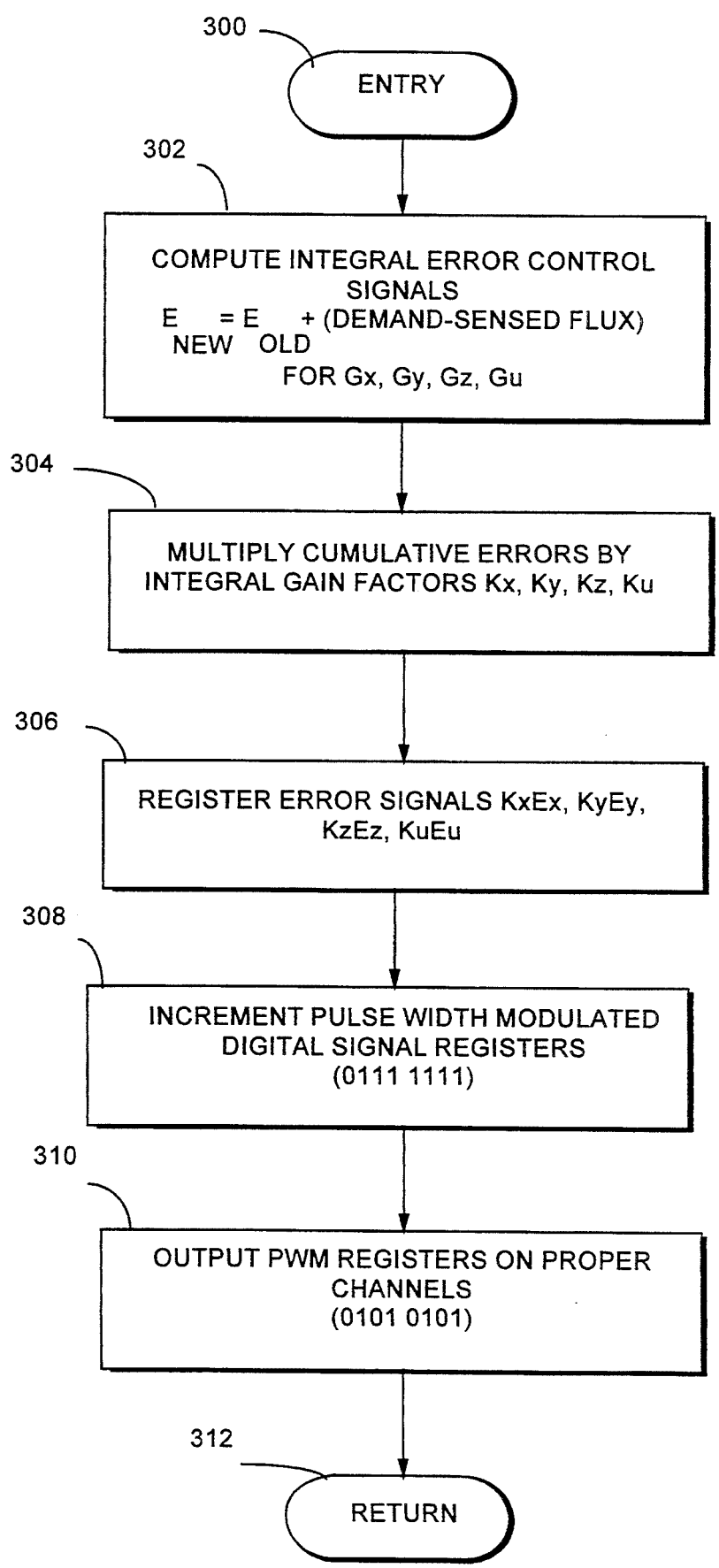
FIG. 3 is a simplified flow diagram of one possible program for the digital signal processor or feedback processing computer of FIG. 2.

The feedback processing computer 102' of FIG. 2 may comprise special purpose hardware digital computing circuits or may comprise essentially the same general purpose computing circuits as in element 102 of FIG. 1 when appropriately programmed. For example, as depicted in the flowchart of FIG. 3, upon entry of this program segment at 300, the usual integral error control signals may be computed at 302 and multiplied by the respectively appropriate gain factors at 304 and stored in appropriate digital signal registers for error signals at 306. So far, the digital signals in the exemplary embodiment are of the usual multi-binary-valued multi-digit variety (i.e., where each successive binary digit represents a successively increasing power of 2). For example, the numerical value of an 8-bit digital word may typically be represented by two hexadecimal digits and may represent 256 integer values as is well-known in the art.

As depicted at block 308 in FIG. 3, a pulse width modulated digital signal register may be updated to represent the desired duty cycle for current drive to a particular gradient coil based upon the earlier computed error signals. As depicted in block 308, for a simplified example, the 8 binary digits representing hexadecimal "EF" are depicted to represent a desired duty cycle of 50%=128/256="EF/FF". By straightforward computation, as should be apparent to those skilled in the art, this first digital signal can be converted at block 310 to an output pulse width modulated register content for the appropriate output channel. In this simplified example, since a 50% duty cycle has been commanded, the output pulse width modulated register is filled with a content of alternating binary values (or possibly by the content 11110000, etc.) so as to produce the requisite 50% duty cycle. Of course, it may be possible to directly generate the PWM output word without first generating a more conventional first digital signal representing the desired duty cycle.

Depending upon the resolution and accuracy that is required, a practical embodiment could of course use a longer output PWM word. For example, one may envision using an output PWM word having 100 binary-valued bits so as to give a resolution of approximately 1% over a range of duty cycles from 0% to 100%. The feedback processing computer 102' might itself be programmed to output the desired PWM digital signals (i.e., a second PWM digital signal that has been generated in block 310 using the first hexadecimal digital signal generated at blocks 306–308). However, it may be desirable to let the feedback processing computer 102' make a normal return to other programmed processes at 312 once the output PWM word has been loaded into an output shift register 350 as depicted in FIG. 2A. As will be recognized by those in the art, FIG. 2A depicts a reentrant shift register. Once loaded with the desired multi-digit (e.g., 100 bits) PWM data, it may be rapidly clocked by load and clock circuit 352 to produce a requisite duty cycle on/off signal to the drive control switch as depicted in FIG. 2A. As will be understood by those in the art, the duty cycle is typically defined as the percentage of time that the power supply circuit is switched "on" (i.e., $(x/y) \times 100\%$ as depicted in FIG. 2A). Where the duty cycle may be changed as in this invention, the term pulse width modulation (PWM) may be used to describe the variable "on" pulse width or duration (i.e., "X" in FIG. 2A). Other equivalent terminology or descriptions may also be used as will be understood.

As will be recognized by those in the art, there are numerous known digital signal processing techniques in both hardware and/or software that may be utilized for directly generating the required digital PWM on/off digital control signal for the switch S in accordance with this invention. For example, counting the number of "high" bits versus the total number of bits in some interval may be one way to express or represent the digital duty cycle. Some techniques could supplement or bypass the integration process (at least temporarily) to speed up the current response times.

If a closed loop control system in accordance with the preferred exemplary embodiment of this invention is not employed, then the virtually all digital control of gradient power supply switches may nevertheless be used to great advantage. For example, as depicted in FIG. 4, the usual gradient coil current sensing resistor R is again employed. Here, even though there is no actual flux sensor, the control computer may generate a flux demand signal as one input to a digital signal processor 400. The analog current sensing signal is immediately converted to digital form by analog to digital convertor 402 and supplied as another input to the signal processor 400. The signal processor 400 may be programmed to integrate the difference between the flux/current demand and the sensed gradient coil current together with an added predetermined real-time pre-emphasis component (e.g., as determined during initial system installation much like present day real-time pre-emphasis factors are determined) to drive a pulse width modulator subroutine of the type described and produce a sequence of single bit on/off switch control output of variable duty cycle as should now be apparent. The digital signal processor 400 could also be programmed to otherwise process the difference signal between the demanded flux/current and the sensed actual current so as to provide the single bit output on/off switch control. In effect, this trades the pulse width modulator form of analog-to-digital converter for a standard analog-to-digital converter 402 in the current sense path. Sensing the gradient coil voltage rather than its current may also be advantageous in some circumstances.

Finally, if a totally open-loop control is utilized as depicted in FIG. 5, then all analog components can be eliminated. Here, the flux demand from the control computer is input to a digital signal processor 500 together with system character parameters (including any needed real-time pre-emphasis factors) from stored data ROM or the like 502 to generate a suitable open loop pre-emphasized pulse width modulated sequence of single bit output values to switch S. In this case, the power supply, main magnet and gradient coils are characterized by appropriate predetermined digital signals that can then be used to predetermine the conversion of those stored system characterizing parameters with any given input flux demand signal to generate an appropriate pulse width modulated string of on/off signals to control the switched gradient power supply. Of course, this completely open-loop approach is considerably inferior to other embodiments. For example, the system characterizing parameters might not be changed over time or temperature (or alternatively, time and temperature parameters must be input so as to change the set of pre-characterizing parameters). It is quite possible that for a given system it may be unworkable.

While the exemplary embodiments have utilized a switched voltage source, it is at least theoretically possible to use a switched current source instead. For example, a switch could alternately short-out the current source or connect it to the electromagnet coil in parallel with a filter capacitor. The switch should theoretically short the current source so effectively that no energy is dissipated in the "off" state. Here, the gradient coil may easily form part of the filter. The filter capacitor keeps the coil voltage finite.

Although the above described embodiments use the difference between flux demanded and the sensed present flux value, the substantially all digital control features of this invention make it possible to go beyond this type of feedback control. For example, other types of more sophisticated comparisons may be made between the flux demand and flux response waveforms. One may thus have a waveform history to help predict future control actions. Possibly the flux demand waveform could thus include "future" values of flux, not just past and present. The digital signal processor could thus plan the duty cycle to get the flux to a desired value more quickly and/or more accurately.

Although only a few specific exemplary embodiments of this invention have been described in detail above, those skilled in the art will recognize that many variations and modifications may be made in these exemplary embodiments while yet retaining many of the novel features and advantages of this invention. Accordingly, all such modifications and variations are intended to be included within the scope of the appended claims.

What is claimed is:

1. In a magnetic resonance imaging system which generates a control signal representing a desired level of electromagnet coil current to be supplied from a switchable electrical power supply via a filter, a method comprising the steps of:
  digitally generating said control signal to have a ratio of first digit values to second digit values that corresponds to the desired level of electromagnet coil current; and
  using said control signal to control the switched duty cycle of said electrical power supply.

2. An improved method as in claim 1 wherein said control signal is generated by:
  sensing the magnetic flux generated by an MRI gradient coil and generating a corresponding analog signal; and
  converting said analog signal to a digital signal which is digitally compared to a supplied digital flux demand signal with the comparison result then being used to produce said control signal representative of a desired level of gradient coil current.

3. An improved method as in claim 2 wherein said comparison result is the difference error between said digital signal corresponding to said analog signal and the digital flux demand signal.

4. An improved method as in claim 1 wherein:
  said control signal is a multi-digit signal with each successive digit having a binary value that represents corresponding successive powers of two; and
  generating a further digital signal that is a multi-digit signal with each successive digit having a binary value which produces a ratio of the number of digits having a first binary value as compared to the number of digits which corresponds to the value of said control digital signal.

5. An improved method as in claim 1 wherein said digitally generating and using steps are repeated for each of plural coil drive control channels having respectively corresponding different levels of coil current.

6. An improved method as in claim 1 wherein said digitally generating and using steps are performed as part of a closed loop control of gradient coil current drive.

7. An improved method as in claim 1 wherein said digitally generating and using steps are performed as part of an open loop control of gradient coil current drive.

8. An improved method as in claim 1 wherein said digitally generating step includes counting the number of successive binary-valued bits having a predetermined value versus the total number of bits in a predetermined time interval.

9. An improved method as in claim 1 wherein the digitally generating step is performed in a programmed digital signal processor.

10. An improved method as in claim 9 wherein said digital signal processor provides an increment of real time pre-emphasis when generating said digital signal representing a desired level of electromagnet coil current.

11. An improved method as in claim 10 wherein said digitally generating and using steps are performed as part of a closed loop control of gradient coil current drive.

12. An improved method as in claim 10 wherein said digitally generating and using steps are performed as part of an open loop control of gradient coil current drive.

13. In a magnetic resonance imaging system which generates a multi-bit digital control signal representing drive current to be attained in an electromagnet coil, the improvement comprising:
  a controlled electrical power supply including a switched drive power source directly connected to multi-bit digital signal processing circuits which directly switch said switched electrical drive power source with digital signals generated by digital signal processing of said digital control signal thus directly controlling the instantaneous duty cycle of electrical power supplied to said electromagnet coil via a smoothing filter.

14. In a magnetic resonance imaging system having a main magnet producing a static field $B_o$ and at least one electromagnet coil for superimposing a magnetic field onto said static field in response to a supplied flux demand signal, an improvement comprising:
  sense means for sensing the coil drive current or magnetic flux produced thereby and for producing an analog sense signal corresponding thereto;
  an analog to digital converter connected to convert said analog sense signal to a corresponding digital sense signal;
  a digital signal processor connected to receive said digital sense signal and a digital flux demand signal, to compare said received signals and to generate a digital on/off output signal representing the instantaneous duty cycle of electrical power to be supplied via a filter to said electromagnet coil to generate a gradient flux corresponding to said flux demand; and
  a switchable electrical power source connected to be switched responsive to said digital on/off output signal suppling electrical current via said filter to said electromagnet coil.

15. An improved magnetic resonance imaging system as in claim 14 wherein said sense means includes a resistor in series with said coil.

16. An improved magnetic resonance imaging system as in claim 14 wherein said sense means includes a gradient flux sensing coil disposed to sense the gradient flux actually produced by said coil.

17. An improved magnetic resonance imaging system as in claim 14 wherein said sense means includes at least one of: a Hall effect probe; a flux gate magnetometer; a magnetically coupled pick-up loop, a SQUID; and an electron magnetic resonance detector.

18. An improved magnetic resonance imaging system as in claim 14 wherein the digital signal processor includes means for adding a predetermined decaying pre-emphasis factor to each received digital flux demand signal.

19. In a magnetic resonance imaging system having a main magnet producing a static field $B_o$ and at least one electromagnet coil for superimposing a magnetic field onto said static field in response to a supplied flux demand signal, an improvement comprising:
  a digital signal processor connected to receive a digital flux demand signal together with digital signals characterizing the magnetic field generating portions of the magnetic resonance imaging system and to generate a digital on/off output signal representing the instantaneous duty cycle of current to be supplied via a filter to said electromagnet coil to generate a magnetic field flux corresponding to said flux demand; and
  a switchable electrical power source connected to be switched responsive to said digital on/off output signal into and out of a filter circuit supplying electrical power to said coil.

* * * * *